United States Patent
Wu et al.

(12) 
(10) Patent No.: US 6,312,974 B1
(45) Date of Patent: Nov. 6, 2001

(54) SIMULTANEOUS BUMPING/BONDING PROCESS UTILIZING EDGE-TYPE CONDUCTIVE PADS AND DEVICE FABRICATED

(75) Inventors: En-Boa Wu; Tsung-Yao Chu, both of Taipei; Hsin-Chien Huang, Hsinchu, all of (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/699,128

(22) Filed: Oct. 26, 2000

(51) Int. Cl.[7] ............................ H10L 21/44; H10L 21/48; H10L 21/50

(52) U.S. Cl. ............................ 438/107; 438/613; 438/113

(58) Field of Search ....................................... 438/612, 614

(56) References Cited

U.S. PATENT DOCUMENTS

| | | | | |
|---|---|---|---|---|
| 5,730,609 | * | 3/1998 | Harwath | 438/108 |
| 6,064,114 | * | 5/2000 | Higginsm III | 257/698 |

* cited by examiner

Primary Examiner—Amir Zarabian
Assistant Examiner—Bradley Smith
(74) Attorney, Agent, or Firm—Tung & Associates

(57) ABSTRACT

A method for simultaneous bumping/bonding an IC chip to a semiconductor substrate and a semiconductor package fabricated by the method are described. In the method, a plurality of edge-type conductive pads formed of under-bump-metallurgy layers are first fabricated on an IC chip by dicing through conductive pads formed on a silicon wafer. The edge-type conductive pads, or UBM layer, are then positioned in close proximity to conductive elements formed on a top surface of a semiconductor substrate. A volume of solder is then applied to the interface between the conductive pads and the conductive elements to form electrical bonds between the two. A suitable method for applying the volume of solder may be a solder jetting technique, a solder printing technique or a method utilizing pre-applied solder paste on the surfaces to be bonded together. The present invention method allows a multiplicity of IC chips equipped with edge-type conductive pads to be fabricated by dicing a silicon wafer through conductive pads formed on a top surface. A multiplicity of IC chips can be fabricated at low fabrication cost. The method further provides the benefit that an IC chip may be bonded to a semiconductor substrate in either a face-up or a face-down position. This is made possible by the conductive pads formed on the vertical edges of the IC chip which connect to conductive elements formed on a semiconductor substrate.

11 Claims, 4 Drawing Sheets

(A)

(B)

(C)

(D)

(E)

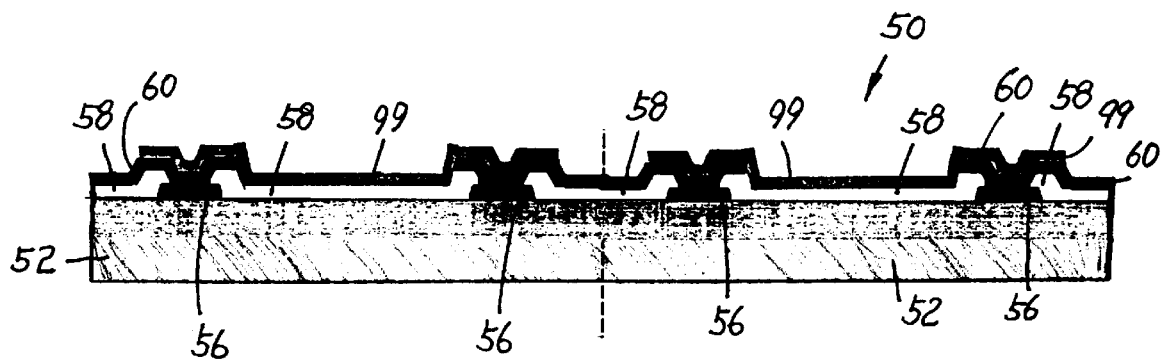
( A )
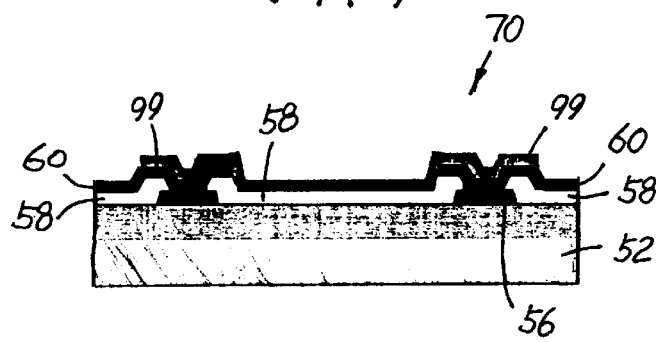
( B )
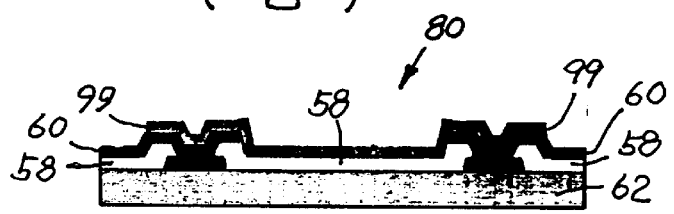
( C )
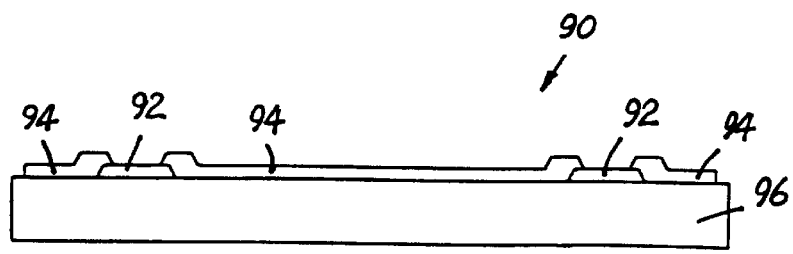
( D )

(E)

(F)

SIMULTANEOUS BUMPING/BONDING PROCESS UTILIZING EDGE-TYPE CONDUCTIVE PADS AND DEVICE FABRICATED

FIELD OF THE INVENTION

The present invention generally relates to a method for simultaneous bumping/bonding an IC chip to a substrate and device fabricated and more particularly, relates to a method for simultaneous bumping/bonding an IC chip to a substrate by first forming edge-type conductive pads of under-bump-metallurgy (UBM) layers on an IC chip and then applying a solder between the edge-type conductive pads and conductive elements on a semiconductor substrate.

BACKGROUND OF THE INVENTION

In the fabrication of modern semiconductor devices, the ever increasing device density and decreasing device dimensions demand more stringent requirements in the packaging or interconnecting techniques in such high density devices. Conventionally, a flip-chip attachment method has been used in packaging of semiconductor chips. In the flip-chip attachment method, instead of attaching a semiconductor die to a lead frame in a package, an array of solder bumps is formed on the surface of the die. The formation of the solder bumps may be carried out in an evaporation method by using a composite material of tin and lead through a mask for producing a desired pattern of solder bumps. The technique of electrodeposition has been more recently developed to produce solder bumps in flip-chip packaging process.

Other techniques that are capable of solder-bumping a variety of substrates to form solder balls have also been proposed. The techniques generally work well in bumping semiconductor substrates that contain solder structures over a minimal size. For instance, one of such widely used techniques is a solder paste screening method which has been used to cover the entire area of an eight inch wafer. However, with recent trend in the miniaturization of device dimensions and the necessary reduction in bump-to-bump spacing (or pitch), the use of the solder paste screening technique has become more difficult.

Other techniques for forming solder bumps such as the controlled collapse chip connection (C4) technique and the thin film electrodeposition technique have also been used in recent years in the semiconductor fabrication industry. The C4 technique is generally limited by the resolution achievable by a molybdenum mask which is necessary for the process. Fine-pitched solder bumps are therefore difficult to be fabricated by the C4 technique. Similarly, the thin film electrodeposition technique which also requires a ball limiting metallurgy layer to be deposited and defined by an etching process which has the same limitations as the C4 technique. For instance, a conventional thin film electrodeposition process for depositing solder bumps is shown in FIGS. 1A~1F.

A conventional semiconductor structure 10 is shown in FIG. 1A. The semiconductor structure 10 is built on a silicon substrate 12 with active devices built therein. A bond pad 14 is formed on a top surface 16 of the substrate 12 for making electrical connections to the outside circuits. The bond pad 14 is normally formed of a conductive metal such as aluminum. The bond pad 14 is passivated by a final passivation layer 20 with a window 22 opened by a photolithography process to allow electrical connection to be made to the bond pad 14. The passivation layer 20 may be formed of any one of various insulating materials such as oxide, nitride or organic materials. The passivation layer 20 is applied on top of the semiconductor device 10 to provide both planarization and physical protection of the circuits formed on the device 10.

Onto the top surface 24 of the passivation layer 20 and the exposed top surface 18 of the bond pad 14, is then deposited an under bump metallurgy layer 26. This is shown in FIG. 1B. The under bump metallurgy (UBM) layer 26 normally consists of an adhesion/diffusion barrier layer 30 and a wetting layer 28. The adhesion/diffusion barrier layer 30 may be formed of Ti, TiN or other metal such as Cr. The wetting layer 28 is normally formed of a Cu layer or a Ni layer. The UBM layer 26 improves bonding between a solder ball to be formed and the top surface 18 of the bond pad 14.

In the next step of the process, as shown in FIG. 1C, a photoresist layer 34 is deposited on top of the UBM layer 26 and then patterned to define a window opening 38 for the solder ball to be subsequently formed. In the following electrodeposition process, a solder ball 40 is electrodeposited into the window opening 38 forming a structure protruded from the top surface 42 of the photoresist layer 34. The use of the photoresist layer 34 must be carefully controlled such that its thickness is in the range between about 30 $\mu$m and about 40 $\mu$m, preferably at a thickness of about 35 $\mu$m. The reason for the tight control on the thickness of the photoresist layer 34 is that, for achieving a fine-pitched solder bump formation, a photoresist layer of a reasonably small thickness must be used such that a high imaging resolution can be achieved. It is known that, during a photolithography process, the thicker the photoresist layer, the poorer is the imaging process. To maintain a reasonable accuracy in the imaging process on the photoresist layer 34, a reasonably thin photoresist layer 34 must be used which results in a mushroom configuration of the solder bump 40 deposited therein. The mushroom configuration of the solder bump 40 contributes greatly to the inability of a conventional process in producing fine-pitched solder bumps.

Referring now to FIG. 1E, wherein the conventional semiconductor structure 10 is shown with the photoresist layer 34 removed in a wet stripping process. The mushroom-shaped solder bump 40 remains while the under bump metallurgy layer 26 is also intact. In the next step of the process, as shown in FIG. 1F, the UBM layer 26 is etched away by using the solder bump 40 as a mask in an wet etching process. The solder bump 40 is then heated in a reflow process to form solder ball 42. The reflow process is conducted at a temperature that is at least the reflow temperature of the solder material.

In recent years, chip scale packages (CSP) have been developed as a new low cost packaging technique for high volume production of IC chips. One of such chip scale packaging techniques has been developed by the Tessera Company for making a so-called micro-BGA package. The micro-BGA package can be utilized in an environment where several of the packages are arranged in close proximity on a circuit board or a substrate much like the arrangement of individual tiles. Major benefits achieved by a micro-BGA package are the combined advantages of a flip chip assembly and a surface mount package. The chip scale packages can be formed in a physical size comparable to that of an IC chip even though, unlike a conventional IC chip such as a flip chip, the chip scale package does not require a special bonding process for forming solder balls. Furthermore, a chip scale package may provide larger number of input/output terminals than that possible from a conventional quad flat package, even though a typical quad flat package is better protected mechanically from the environment.

In a typical micro-BGA package, a flexible interposer layer (which may contain circuit) is used to interconnect bond pads on an IC chip to an array of solder bump connections located on a flexible circuit. The flexible circuit, normally of a thickness of approximately 25 μm, is formed of a polymeric material such as polyimide which is laminated to a silicon elastomer layer of approximately 150 μm thick. The silicon elastomeric layer provides flexibility and compliance in all three directions for relief of stresses and thermal expansion mismatches. To further reduce the fabrication cost of IC devices, it is desirable that if a whole wafer can be passivated to seal the IC dies on the wafer, and then be severed into individual IC dies from the wafer such that not only the benefits of a chip scale package can be realized, the packaging cost for the IC dies may further be reduced.

The conventional flip-chip bonding process requires multiple preparation steps for IC chips, i.e. the formation of aluminum bond pads on the chip, the under-bump-metallurgy process on the bond pads and the deposition of solder required in the bumping process. The substrate that the IC chip is bonded to requires a flux coating in order to ensure an acceptable bond strength is formed between the solder bumps and the conductive elements on the substrate surface. The flip chip bonding process further requires a reflow process for the bumps, a flux cleaning process to eliminate excess flux material from the surface of the bump, a drying process after the cleaning process, an underfill process for dispensing an underfill material, and an underfill curing process to minimize thermal stresses in the underfill and in the joint formed.

The conventional method for depositing solder bumps described above therefore presents a number of processing difficulties. For instance, one of the difficulties is the large volume of solder used to form a mushroom-shaped bump which impedes the process of making fine-pitched bumps. Another difficulty is the requirement of a flux coating step to ensure adhesion between a bump pad and a solder bump. The requirement of an additional UBM coating process further complicates the flip chip bonding method and increases its costs. It is therefore desirable to implement a flip chip bonding process that does not require separate processing steps for forming the solder bumps and for bonding the bumps to a substrate.

It is therefore an object of the present invention to provide a method for simultaneous bumping/bonding an IC chip to a substrate that does not have the drawbacks or shortcomings of the conventional bump forming and bonding method.

It is another object of the present invention to provide a method for simultaneous bumping/bonding an IC chip to a substrate utilizing edge-type conductive pads formed on the IC chip for bonding to conductive elements formed on a semiconductor substrate.

It is a further object of the present invention to provide a method for simultaneous bumping/bonding an IC chip to a substrate by first forming conductive pads on a wafer surface and then dicing the wafer to form edge-type conductive pads on each IC chip diced from the wafer.

It is another further object of the present invention to provide a method for simultaneous bumping/bonding an IC chip to a semiconductor substrate by first aligning edge-type conductive pads on an IC chip to conductive elements on a semiconductor substrate and then applying a solder therein between.

It is still another object of the present invention to provide a method for simultaneous bumping/bonding an IC chip to a semiconductor substrate by first forming conductive pads on a wafer surface and then dicing the wafer through a center line of the conductive pads.

It is yet another object of the present invention to provide a method for simultaneous bumping/bonding an IC chip to a semiconductor substrate by first forming a plurality of conductive pads on a wafer surface and then dicing the wafer into a plurality of IC chips each having at least one edge-type conductive pad formed on at least one edge.

It is still another further object of the present invention to provide a semiconductor package formed of an IC chip bonded to a substrate wherein the IC chip has a conductive pad exposed on a vertical edge of the chip bonded to a conductive element on a semiconductor substrate by a volume of solder.

It is yet another further object of the present invention to provide a semiconductor package formed of an IC chip bonded to a substrate wherein the IC chip has an edge-type conductive pad formed on a vertical edge of the chip by layers of under-bump-metallurgy materials such as a diffusion barrier layer and a wetting layer.

SUMMARY OF THE INVENTION

In accordance with the present invention, a method for simultaneous bumping/bonding an IC chip to a substrate and a semiconductor package assembled together by the method are disclosed.

In a preferred embodiment, a method for simultaneous bumping/bonding an IC chip to a substrate can be carried out by the operating steps of first providing a semiconductor wafer that has active devices formed thereon; forming a first plurality of electrically conductive pads each in electrical communication with one of the active devices; forming an electrically insulating layer between the first plurality of electrically conductive pads and insulating the first plurality of electrically pads from each other; forming a second plurality of electrically conductive pads over the first plurality of electrically conductive pads such that each of the second plurality of electrically conductive pads provides electrical communication between two adjacent ones of the first plurality of electrically conductive pads; dicing the semiconductor wafer through each of the second plurality of electrically conductive pads into a multiplicity of IC chips each having at least one of the second plurality of electrically conductive pads exposed on an edge; providing a semiconductor substrate that has at least one conductive element formed on a top surface; positioning one of the multiplicity of IC chips on top of and spaced-apart from the top surface of the semiconductor substrate such that one of the at least one exposed second plurality of electrically conductive pads is immediately adjacent to one of the at least one conductive elements on the top surface of the semiconductor substrate; and depositing a solder between one of the at least one exposed second plurality of electrically conductive pads and one of the at least one conductive elements and providing electrical communication therein between.

The method for simultaneous bumping/bonding an IC chip to a substrate may further include the step of providing the semiconductor substrate in a multi-chip module, or the step of forming the first plurality of electrically conductive pads in a conductive metal selected from the group consisting of aluminum, aluminum alloys, copper and copper alloys. The method may further include the step of forming the electrically insulating layer in a material of silicon oxide, silicon nitride or silicon oxynitride. The method may further include the step of forming the second plurality of electrically conductive pads in under-bump-metallurgy layers, or the step of forming the UBM layers in composite layers of an adhesion/diffusion barrier layer and a wetting layer. The method may further include the step of forming the at least one of the second plurality of electrically conductive pads exposed on a vertical edge of the IC chip.

The method for simultaneous bumping/bonding an IC chip to a semiconductor substrate may further include the step of depositing solder by a solder jetting technique, or the step of depositing solder by a solder printing technique, or the step of pre-applying a solder paste to surfaces of the at least one exposed second plurality of electrically conductive pads and the at least one conductive elements, and then contacting the surfaces together at a solder reflow temperature. The method may further include the step of reflowing the solder at a solder reflow temperature after the solder deposition step.

The present invention is further directed to a semiconductor package that is formed of an IC chip bonded to a substrate which includes an IC chip that has a conductive pad exposed on a vertical edge of the chip, the conductive pad is in electrical communication with an input/output pad and an active circuit in the chip; a semiconductor substrate that has a conductive element on a top surface; and a body of solder electrically connecting the conductive pad on the IC chip to the conductive element on the semiconductor substrate.

In the semiconductor package formed of an IC chip bonded to a semiconductor substrate, the conductive pad exposed on the vertical edge of the IC chip is formed of under-bump-metallurgy layers. The IC chip may be bonded in a face-up position, or in a face-down position. The body of solder is reflown into a ball shape. The UBM layers are formed of an adhesion/diffusion barrier layer on top of a wetting layer. The substrate may be a multi-chip module. The conductive element may be formed of a conductive metal of aluminum, aluminum alloys, copper or copper alloys. The conductive pad exposed on the vertical edge of the chip may be insulated by a dielectric material layer of silicon oxide, silicon nitride or silicon oxynitride.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a method for simultaneous bumping/bonding an IC chip to a semiconductor substrate and a semiconductor package assembled together of an IC chip and a semiconductor substrate by the method.

In the method, an IC chip that has at least one edge-type conductive pad formed of UBM layers is first provided. The IC chip may be advantageously formed by first forming a plurality of conductive pads on a top surface of a wafer, and then dicing the wafer into a plurality of IC chips through a centerline of the conductive pads such that each chip has at least one conductive pad exposed on one edge. The IC chip with the edge-type conductive pad exposed on at least one edge is then positioned juxtaposed to a semiconductor substrate such that the edge-type conductive pad is positioned immediately adjacent to a conductive element on the semiconductor substrate. A body of solder is then applied to an interface between the edge-type conductive pad on the IC chip and the conductive element on the semiconductor substrate to form a solder bond between the two. The conductive pads or the conductive elements may be advantageously formed of a conductive metal such as aluminum, aluminum alloys, copper or copper alloys.

The edge-type conductive pads on the IC chip may be formed of under-bump-metallurgy layers, i.e. layers of an adhesive/diffusion barrier layer and a wetting layer. The edge-type conductive pads are each connected to one of a plurality of input/output (I/O) pads situated on top of the IC chip each in turn is connected to an active circuit. An insulating layer, formed of a material such as silicon oxide, silicon nitride or silicon oxynitride, may be used to insulate the edge-type conductive pad from the input/output pad at areas where electrical communication between the two layers is not needed. For instance, on the vertical edge of the IC chip, only the conductive pad should be exposed, not the input/output pad which should be covered or insulated by the insulating material layer. There may be another passivation layer, such as PI, BCB, etc, used to cover the edge type trace except the opening of the conductive pad.

The present invention further discloses a semiconductor package that is formed of an IC chip bonded to a semiconductor substrate wherein an IC chip is first provided equipped with a conductive pad exposed on a vertical edge of the chip. The conductive pad is in electrical communication with an input/output pad and an active circuit in the IC chip. After the IC chip is positioned juxtaposed to a semiconductor substrate with the conductive pad situated immediately adjacent to a conductive element on the top surface of the substrate, a volume of solder is applied to electrically connect the conductive pad on the IC chip to the conductive element on the semiconductor substrate.

Figure 1:
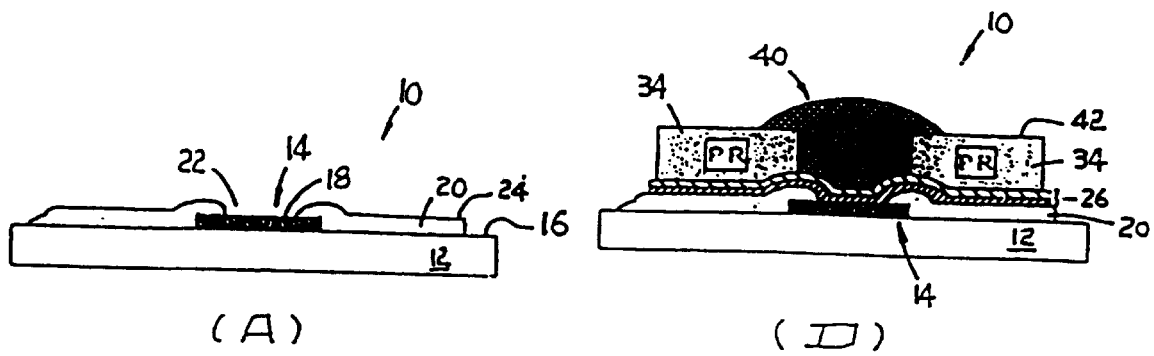
FIG. 1A is an enlarge, cross-sectional view of a conventional IC chip having a bond pad and an insulating material layer formed thereon.
FIG. 1B is an enlarged, cross-sectional view of the conventional IC chip of FIG. 1A with UBM layers deposited on top.
FIG. 1C is an enlarged, cross-sectional view of the conventional IC chip of FIG. 1B with a dielectric layer deposited and patterned on top.
FIG. 1D is an enlarged, cross-sectional view of the conventional IC chip of FIG. 1C with a solder paste deposited in an opening forming a solder bump.
FIG. 1E is an enlarged, cross-sectional view of the conventional IC chip of FIG. 1D with the dielectric mask layer removed.
FIG. 1F is an enlarged, cross-sectional view of the conventional IC chip of FIG. 1E with the solder bump reflown into a solder ball.
Figure 1:
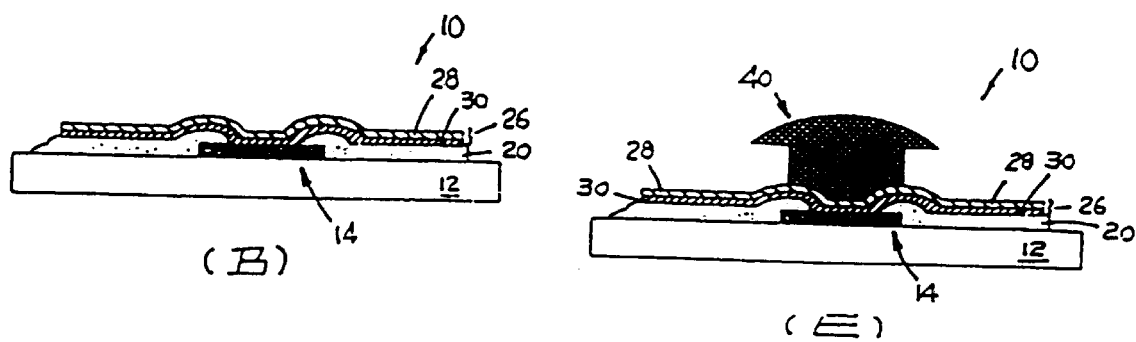
Figure 1:
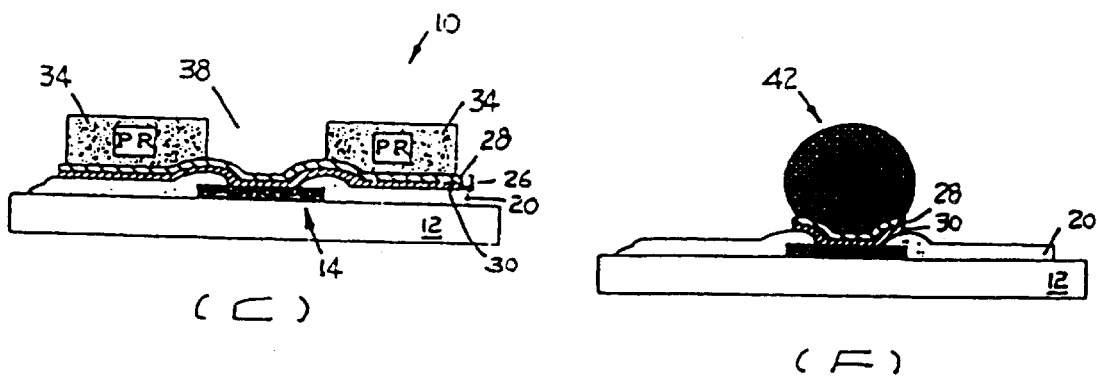
Figure 2:
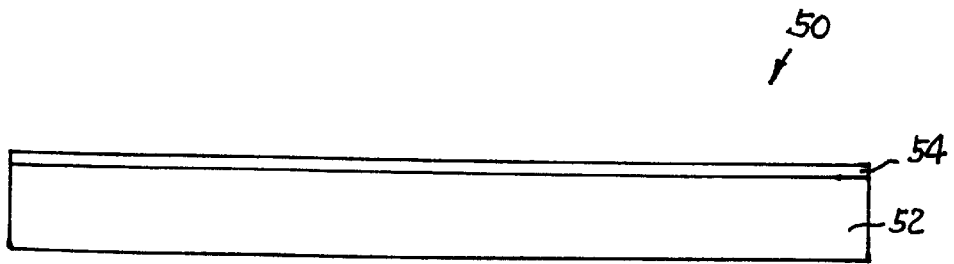
FIG. 2A is an enlarged, cross-sectional view of a present invention IC chip with a first metal layer sputter deposited on a silicon substrate.
FIG. 2B is an enlarged, cross-sectional view of the present invention IC chip of FIG. 2A with the metal layer patterned and formed.
FIG. 2C is an enlarged, cross-sectional view of the present invention IC chip of FIG. 2B with an insulating material layer deposited on top of the conductive pads and the silicon substrate.
FIG. 2D is an enlarged, cross-sectional view of the present invention IC chip of FIG. 2C with the insulating material layer partially removed to expose the conductive pads.
FIG. 2E is an enlarged, cross-sectional view of the present invention IC chip of FIG. 2D with a second metal layer deposited on top of the insulating material layer and the plurality of conductive pads.
Figure 2:
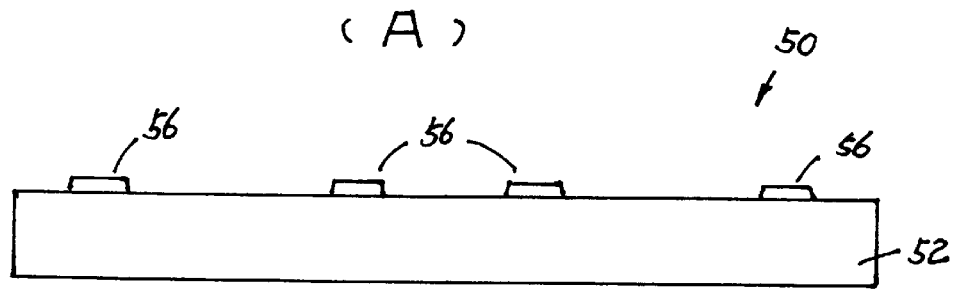
Figure 2:
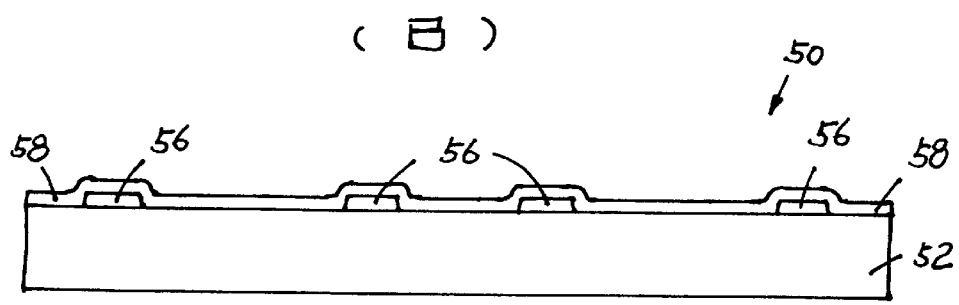
Figure 2:
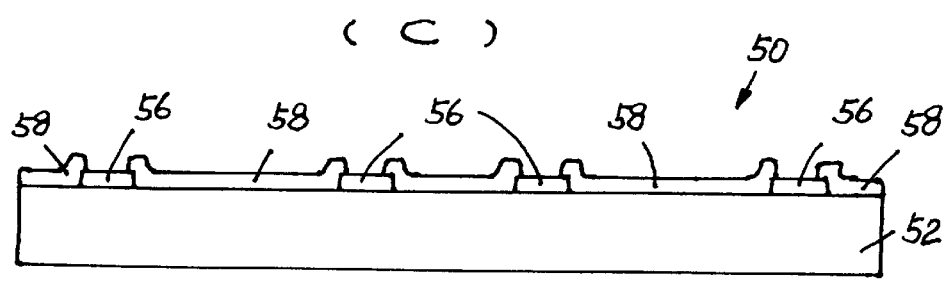
Figure 2:
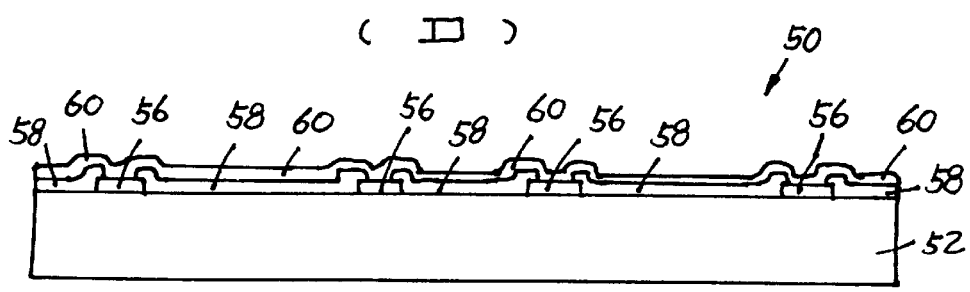

Referring now to FIG. 2A, wherein a present invention semiconductor wafer 50 consists of a silicon substrate 52 containing active devices formed therein and an overlying metal layer 54 sputter deposited on top. The metal layer 54 may be suitably deposited of a conductive metal selected from aluminum, aluminum alloys, copper or copper alloys. Other suitable deposition method such as chemical vapor deposition (CVD) may also be used to deposit the metal layer.

A standard photolithographic method is used to form the metal layer 54 into a plurality of conductive pads 56 on top of the silicon substrate 52. A dielectric insulating layer 58 is then blanket deposited on top of the present invention semiconductor wafer 50. This is shown in FIG. 2C. A suitable material for the dielectric material layer 58 can be silicon oxide, silicon nitride or silicon oxynitride. A second photolithographic method is then used to pattern and remove the dielectric layer 58 from the top surfaces of the plurality of conductive pads 56 resulting in exposed top surfaces of the pads. This is shown in FIG. 2D. In the next step of the process, as shown in FIG. 2E, a second metal layer 60 is blanket deposited on top of the semiconductor wafer 50.

Figure 3:
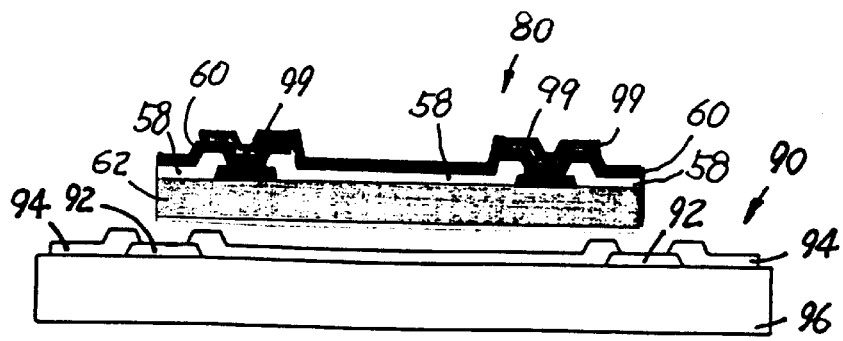
FIG. 3A is an enlarged, cross-sectional view of the present invention IC chip with the second metal layer formed and patterned such that it provides electrical communication with the conductive pads formed of the first metal layer.
FIG. 3B is an enlarged, cross-sectional view of the present invention IC chip of FIG. 3A after diced from the wafer.
FIG. 3C is an enlarged, cross-sectional view of the present invention IC chip with the backside of the wafer removed to thin down the wafer.
FIG. 3D is an enlarged, cross-sectional view of a semiconductor substrate that has conductive elements formed on a top surface.
FIG. 3E is an enlarged, cross-sectional view of the present invention IC chip positioned on top of and spaced-apart from the semiconductor substrate with the edge-type conductive pads positioned immediately adjacent to the conductive elements on the top surface of the substrate.
FIG. 3F is an enlarged, cross-sectional view illustrating the present invention solder jetting process for forming a solder bond between the IC chip and the semiconductor substrate with the IC chip in a face-up position.
Figure 3:
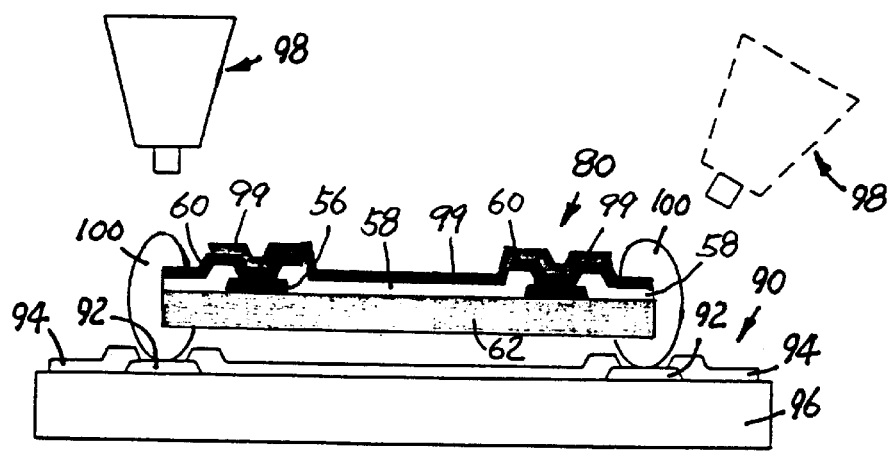

By utilizing a third photolithographic patterning and dry etching method, as shown in FIG. 3A, the unwanted layer of the second metal 60 is removed such that the second metal layer 60 only covers the conductive pads 56. A passivation layer 99 formed of a material such as polyimide, BCB, etc, is then formed on top for the edge type pad.

The unique processing steps of the present invention novel method can be advantageously performed on a semiconductor wafer, i.e. in a wafer scale processing for achieving low cost fabrication of IC chips. After the unwanted second metal layer 60 is removed and the traces are covered by passivation layer 99, the semiconductor wafer is ready for dicing along the center lines of the conductive pads 60 formed on the top surface of the wafer 50. This unique process allows the fabrication of a multiplicity of IC chips 70 by the invention method each equipped with at least one edge-type conductive pad 60 for making subsequent connection to a semiconductor substrate. As best shown in FIG. 3B, the IC chip 70 is provided with two exposed edge-type conductive pads 60 wherein each of the conductive pads 60 is in electrical communication with an input/output pad 56, which in turn electrically connects to an active device in the semiconductor substrate 52.

It should be noted that while the unique configuration of the edge-type conductive pad 60 enables a subsequent bonding process to be accomplished between the IC chip 70 and the semiconductor substrate 90 (shown in FIG. 3D), however, before the bonding process can be carried out, the IC chip 70 should be thinned down by removing the backside of the silicon substrate 52 such that only a thin section 62 remains. The thinning step of the silicon substrate 52 is important in the present invention bonding process since only a thin substrate 62 allows the IC chip 80 to be positioned in close proximity to the semiconductor substrate 90. This is clearly shown in FIG. 3E, wherein a thinned IC chip 80 is positioned immediately adjacent to the top surface of the semiconductor substrate 90. It should be noted that a plurality of conductive elements 92 may be provided on a top surface of the substrate 90 for making electrical connections with the IC chip 80. The plurality of conductive elements 92 is insulated by a dielectric layer 94 which may be advantageously formed of solder masks, silicon oxide, silicon nitride or silicon oxynitride. It should be noted that the semiconductor substrate 90 may be formed of a material 96 that is any suitable substrate material.

The present invention method for bonding the IC chip 80 to the semiconductor substrate 90 is shown in FIG. 3F, with the IC chip 80 placed in a face-up position. A solder jetting apparatus 98 is provided to inject solder droplets (not shown) into the interface between the edge-type conductive pad 60 on the IC chip 80 and the conductive element 92 on the semiconductor substrate 90 forming a volume of solder 100. This is shown in FIG. 3F. It should be noted that the position of the solder jetting device 98 can be suitably adjusted such that it is positioned at an angle to the interface formed between the two parts to be bonded together.

It should also be noted that other than the solder jetting method, shown in FIG. 3F, other convenient methods for dispensing solder at the interface formed between the conductive pads and the conductive elements may also be used. These suitable methods may include stencil printing, screen printing and a method for pre-applying solder paste on the two surfaces to be joined together. A solvent-containing solder paste material is normally used in such processes.

Figure 4:
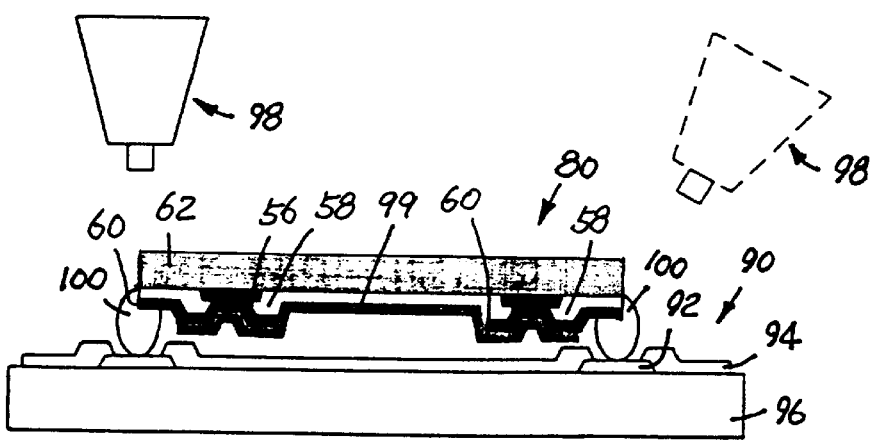
FIG. 4 is an enlarged, cross-sectional view of an alternate method of the present invention with the IC chip in aa face-down posit ion on top of a semiconductor substrate.

Another advantage made possible by the present invention novel method, as shown in FIG. 4, is that the IC chip 80 may be joined to the semiconductor substrate 90 in a face-down position. Utilizing the edge-type conductive pads provided on the IC chip 80, chip 80 may be easily joined to the semiconductor substrate 90 in the upside down position. The volume of solder 100 electrically connects the edge-type conductive pad 60 on the IC chip 80 to the conductive element 92 on the semiconductor substrate 90. It should be noted that while the present invention novel method can be practiced with the IC chip placed either in a face-up or in a face-down position, the face-up position of the IC chip 80 is especially suited for applications such as image sensors or optical sensors.

The present invention method may further include a step of solder reflow, which may be conducted after the solder deposition process by heating the solder to a reflow temperature by either laser energy or hot air. The present invention method may be applicable to packaging of various semiconductor devices as optical sensors, image sensors, three-dimensional packages, ultra-thin packages or direct chip attachment (DCA).

The present invention novel method for simultaneous bumping/bonding an IC chip to a semiconductor substrate and a semiconductor package fabricated by the method have therefore been amply described in the above description and in the appended drawings of FIGS. 2A–4.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

What is claimed is:

1. A method for simultaneous bumping/bonding an IC chip to a substrate comprising the steps of:

providing a semiconductor wafer having active devices built thereon;

forming a first plurality of electrically conductive pads each in electrical communication with one of said active devices;

forming an electrically insulating layer between said first plurality of electrically conductive pads and insulating said fist plurality of electrically conductive pads from each other;

forming a second plurality of electrically conductive pads over said first plurality of electrically conductive pads such that each of said second plurality of electrically conductive pads provides electrical communication between two adjacent ones of said first plurality of electrically conductive pads;

depositing a passivation layer of a dielectric material on top of said wafer;

dicing said semiconductor wafer through each of said second plurality of electrically conductive pads into a multiplicity of IC chips each having at least one of said second plurality of electrically conductive pads exposed on an edge;

providing a semiconductor substrate having at least one conductive element formed on a top surface;

positioning one of said multiplicity of IC chips on top of and spaced-apart from said top surface of the semiconductor substrate such that one of said at least one exposed second plurality of electrically conductive pads is immediately adjacent to one of said at least one conductive elements on said top surface of the semiconductor substrate; and depositing a solder between said one of said at least one exposed second plurality of electrically conductive pads and said one of said at least one conductive element and providing electrical communication therein between.

2. A method for simultaneous bumping/bonding an IC chip to a substrate according to claim 1 further comprising the step of providing said semiconductor substrate in a multi-chip module.

3. A method for simultaneous bumping/bonding an IC chip to a substrate according to claim 1 further comprising the step of forming said first plurality of electrically conductive pads in a conductive metal selected from the group consisting of aluminum, aluminum alloys, copper and copper alloys.

4. A method for simultaneous bumping/bonding an IC chip to a substrate according to claim 1 further comprising the step of forming said electrically insulating layer in a material of silicon oxide, silicon nitride or silicon oxynitride.

5. A method for simultaneous bumping/bonding an IC chip to a substrate according to claim 1 further comprising the step of forming said second plurality of electrically conductive pads in under-bump-metallurgy (UBM) layers.

6. A method for simultaneous bumping/bonding an IC chip to a substrate according to claim 5 further comprising the step of forming said UBM layers in composite layers of an adhesion/diffusion barrier layer and a wetting layer.

7. A method for simultaneous bumping/bonding an IC chip to a substrate according to claim 1 further comprising the step of forming said at least one of said second plurality of electrically conductive pads exposed on a vertical edge of said IC chip.

8. A method for simultaneous bumping/bonding an IC chip to a substrate according to claim 1 further comprising the step of depositing said solder by a solder jetting technique.

9. A method for simultaneous bumping/bonding an IC chip to a substrate according to claim 1 further comprising the step of depositing said solder by a solder printing technique.

10. A method for simultaneous bumping/bonding an IC chip to a substrate according to claim 1 further comprising the step of pre-applying a solder to surfaces of said at least one exposed second plurality of electrically conductive pads and said at least one conductive element, and then contacting said surfaces together at a solder reflow temperature.

11. A method for simultaneous bumping/bonding an IC chip to a substrate according to claim 1 further comprising the step of reflowing said solder at a solder reflow temperature after said solder deposition step.

* * * * *